United States Patent
Park

(10) Patent No.: US 7,863,077 B2
(45) Date of Patent: Jan. 4, 2011

(54) IMAGE SENSOR AND METHOD FOR MANUFACTURING THE SAME

(75) Inventor: Dong Bin Park, Dong-gu (KR)

(73) Assignee: Dongbu Hitek Co., Ltd., Seoul (KR)

(*) Notice: Subject to any disclaimer, the term of this patent is extended or adjusted under 35 U.S.C. 154(b) by 0 days.

(21) Appl. No.: 12/212,083

(22) Filed: Sep. 17, 2008

(65) Prior Publication Data

US 2009/0085079 A1    Apr. 2, 2009

(30) Foreign Application Priority Data

Sep. 27, 2007    (KR) .............. 10-2007-0097299

(51) Int. Cl.
*H01L 21/311* (2006.01)
*H01L 31/113* (2006.01)

(52) U.S. Cl. .............. 438/60; 438/59; 438/75; 438/282; 438/297; 438/771; 257/292; 257/E29.165; 257/E27.133; 257/E31.114

(58) Field of Classification Search ..............
257/E31.001–E31.131, 414–470, 288–413, 257/72, 635, E27.133–E27.14, E29.165; 438/589, 48–98, 197–308, 758–794, 585, 438/591
See application file for complete search history.

(56) References Cited

U.S. PATENT DOCUMENTS

| | | | |
|---|---|---|---|
| 6,936,503 B2* | 8/2005 | Takehiro | 438/142 |
| 2004/0023454 A1* | 2/2004 | Yao et al. | 438/216 |
| 2006/0081887 A1* | 4/2006 | Lyu | 257/215 |
| 2007/0145510 A1* | 6/2007 | Lim | 257/462 |
| 2007/0155082 A1* | 7/2007 | Shim | 438/199 |

* cited by examiner

*Primary Examiner*—Matthew C Landau
*Assistant Examiner*—Aaron Staniszewski
(74) *Attorney, Agent, or Firm*—Saliwanchik, Lloyd & Saliwanchik

(57) ABSTRACT

An image sensor and method of manufacturing the same are disclosed. A semiconductor substrate can be prepared comprising a photodiode region, a transistor region, and a floating diffusion region. A gate dielectric can be disposed under a surface of the semiconductor substrate in the transistor region. A first dielectric pattern can be provided having a portion above and a portion below the surface of the semiconductor substrate in the photodiode and the floating diffusion regions. A second dielectric can be disposed under the gate dielectric. The second dielectric can extend the depth of the gate dielectric into the semiconductor substrate to space the movement path of photoelectrons from the photodiode region to the floating diffusion region.

9 Claims, 4 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0097299, filed Sep. 27, 2007, which is hereby incorporated by reference in its entirety.

BACKGROUND

In general, a unit pixel of a complementary metal oxide semiconductor (CMOS) image sensor includes a photodiode and a metal oxide semiconductor (MOS) transistor. The CMOS image sensor sequentially detects an electrical signal of each unit pixel in a switching manner to generate an image.

CMOS image sensors are classified into 3T-type, 4T-type, and 5T-type CMOS image sensors according to the number of transistors in each unit pixel. For example, a unit pixel of the 4T-type CMOS image sensor includes a photodiode PD, a transfer transistor Tx, a reset transistor Rx, a drive transistor Dx, and a select transistor Sx. The photodiode PD receives light to generate photoelectric charges. The transfer transistor Tx transfers photoelectric charges generated in the photodiode PD to a floating diffusion region FD. The reset transistor Rx sets an electric potential of the floating diffusion region FD to a desired level and resets the floating diffusion region FD by discharging photoelectric charges. The drive transistor Dx serves as a source follower buffer amplifier, in which a voltage of the floating diffusion region FD is applied to a gate. The select transistor Sx performs an addressing through a switching operation.

In such a CMOS image sensor, light is incident to a photodiode to generate an electron-hole pair in the photodiode and the electron-hole pair is moved to a floating diffusion region.

Here, a defect such as a dangling bond may occur on the surface of a semiconductor substrate. The dangling bond traps electric charges to cause noise when the electric charges moves from the photodiode to the floating diffusion region.

BRIEF SUMMARY

Embodiments of the present invention provide an image sensor and a method of manufacturing the same that can improve the optical characteristics of the image sensor.

In one embodiment, an image sensor can comprise: a semiconductor substrate comprising a photodiode region, a transistor region, and a floating diffusion region; a gate dielectric below a top surface of the semiconductor substrate in the transistor region; a first dielectric pattern having a portion above and a portion below the top surface of the semiconductor substrate in the photodiode and the floating diffusion regions; and a second dielectric under the gate dielectric, extending the depth of the gate dielectric below the top surface of the semiconductor substrate.

In another embodiment, a method of manufacturing an image sensor can comprise: providing a semiconductor substrate comprising a photodiode region, a transistor region, and a floating diffusion region; forming a gate dielectric below a surface of the semiconductor substrate in the transistor region; forming a first dielectric pattern having a portion above and a portion below the surface of the semiconductor substrate in the photodiode and the floating diffusion regions; and forming a second dielectric under the gate dielectric to extend the depth of the gate dielectric below the surface of the semiconductor substrate.

The details of one or more embodiments are set forth in the accompanying drawings and the description below. Other features will be apparent from the description and drawings, and from the claims.

DETAILED DESCRIPTION

Embodiments of an image sensor and a method of manufacturing the same will now be described in detail with reference to the accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

It is to be understood that the figures and descriptions of embodiments of the present invention have been simplified to illustrate elements that are relevant for a clear understanding of the invention, while eliminating, for purposes of clarity, other elements that may be well known. Those of ordinary skill in the art will recognize that other elements may be desirable and/or required in order to implement the present invention. However, because such elements are well known in the art, and because they do not facilitate a better understanding of the present invention, a discussion of such elements is not provided herein.

Figure 8:
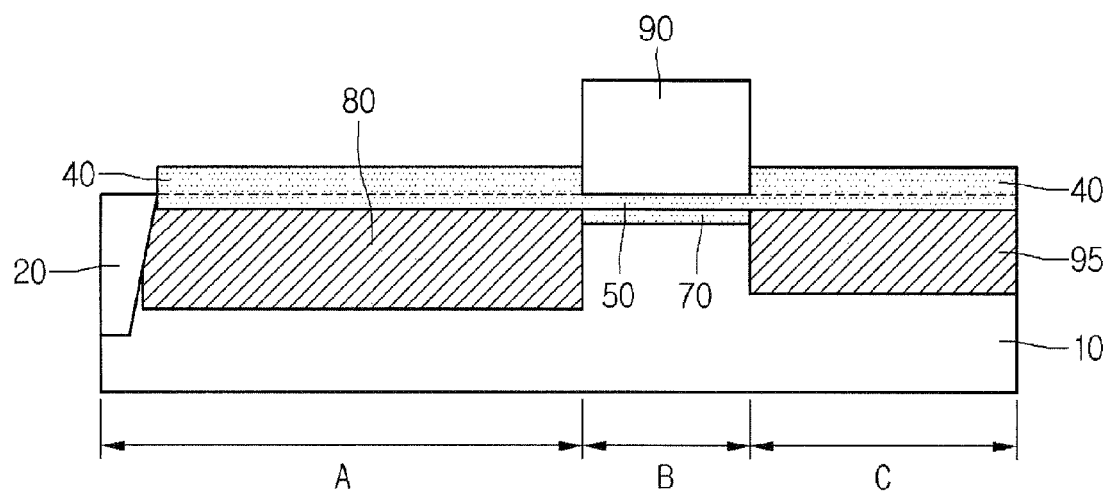

Referring to FIG. 8, an image sensor according to an embodiment of the present invention includes a photodiode region A, a transistor region B, and a floating diffusion region C on a semiconductor substrate 10; a gate dielectric 50; a first dielectric pattern 40; and a second dielectric 70. The gate dielectric 50 is disposed below a top surface (shown as dotted line) of the semiconductor substrate 10 in the transistor region B. The first dielectric pattern 40 is disposed having a portion below and a portion above the top surface of the semiconductor substrate 10 in the photodiode region A and the floating diffusion region C. The second dielectric 70 is disposed under the gate dielectric 50.

The gate dielectric 50, the first dielectric pattern 40, and the second dielectric 70 can be formed of an oxide (e.g., $SiO_2$).

A gate 90 is disposed on the gate dielectric 50 in the transistor region B. A photodiode 80 is disposed under the first dielectric pattern 40 in the photodiode region A. A floating node 95 is disposed under the first dielectric pattern 40 in the floating diffusion region C.

According to an embodiment, an image sensor can space an electron transfer path from the photodiode to the floating node by a predetermined distance from the surface of the semiconductor substrate, thereby inhibiting an electron trap or a flicker noise due to a defect including a dangling bond generated on the surface of the semiconductor substrate and improving optical characteristics.

A method of manufacturing an image sensor according to an embodiment will now be described with reference to FIGS. 1 to 8.

Figure 1:
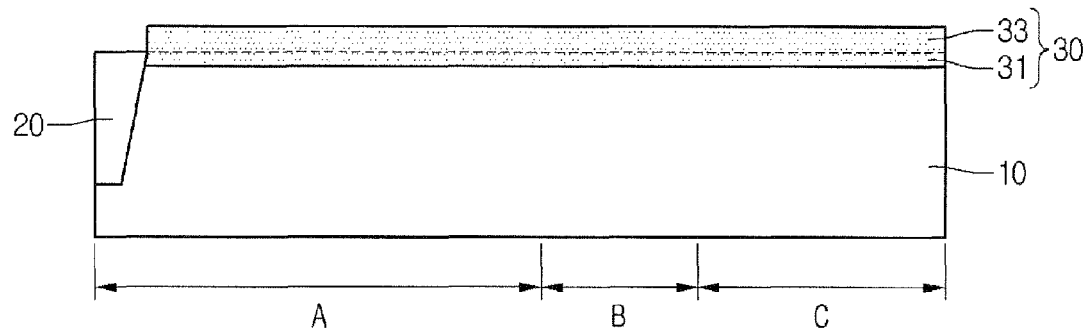
FIGS. 1 to 8 are cross-sectional views illustrating a process of manufacturing an image sensor according to an embodiment.

Referring to FIG. 1, a first dielectric 30 can be formed on a semiconductor substrate 10.

The semiconductor substrate 10 can be, for example, a heavily doped p-type substrate (p++) having a lightly doped p-type epi layer. An epitaxial process can be performed on the heavily doped p-type substrate to form the lightly doped p-type epi layer.

A plurality of device isolation regions 20, defining an active region and a field region, can be formed in the semiconductor substrate 10. A unit pixel including a photodiode and a transistor will be formed on the active region. A region including the photodiode is referred to as the photodiode region A. A region including a gate of the transistor is referred to as the transistor region B. A region including a floating node is referred to as the floating diffusion region C.

The first dielectric 30 can be formed on the active region of the semiconductor substrate 10. In an embodiment, the first dielectric 30 can be formed of an oxide (e.g., $SiO_2$) in an $O_2$ gas atmosphere through a heat-treating process.

The first dielectric 30 reacts with silicon of the semiconductor substrate 10 such that it forms above and below the surface (see dotted line) of the semiconductor substrate 10. For example, a portion of the first dielectric 30 formed above the surface of the semiconductor substrate 10 can be referred to as an upper dielectric 33, and the other portion of the first dielectric 30, formed below the surface of the semiconductor substrate 10, can be referred to as a lower dielectric 31. A height ratio of the upper dielectric 33 to the lower dielectric 31 can be about 2:1. The height ratio may be modified according to the conditions of the dielectric formation process.

Figure 2:
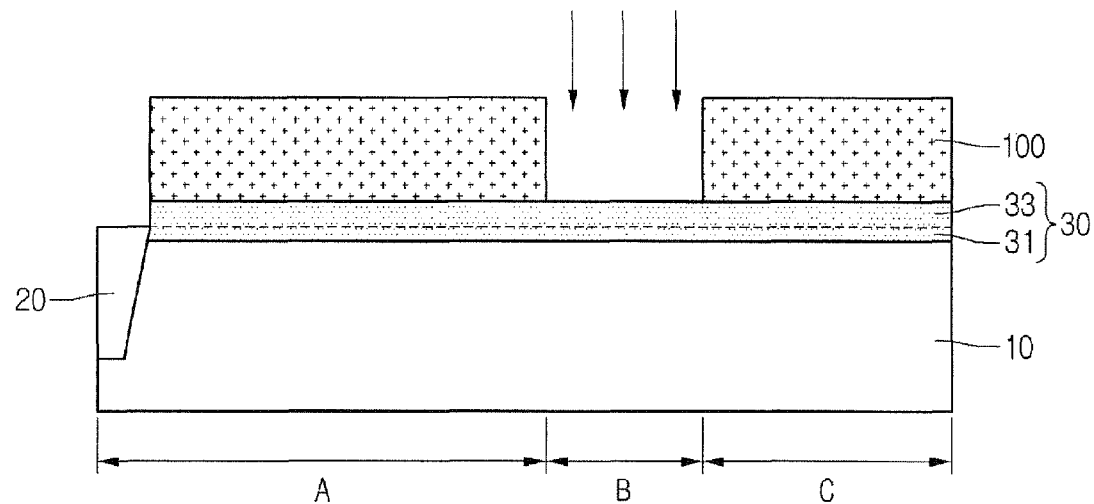

Referring to FIG. 2, a first photoresist pattern 100 can be formed to expose the transistor region B on the semiconductor substrate 10. The first photoresist pattern 100 can be formed to expose a surface of the first dielectric 30 corresponding to the transistor region B, but covers surfaces of the first dielectric 30 corresponding to the photodiode region A and the floating diffusion region C.

Then, an etching process can be performed on the first dielectric 30 using the first photoresist pattern 100 as a mask. In certain embodiments, a portion of the exposed first dielectric 30 can be removed through a wet or dry etching method.

Thus, the upper dielectric 33 portion of the first dielectric 30 disposed in the transistor region B and exposed by the first photoresist pattern 100 can be removed. In addition, other portions of the first dielectric 30 disposed in the photodiode region A and the floating diffusion region C covered by the first photoresist pattern 100 remain. As such, since the portion of the upper dielectric 33 in the transistor region B is removed, only the lower dielectric 31 remains in the transistor region B of the semiconductor substrate 10.

Thereafter, the first photoresist pattern 100 can be removed.

Figure 3:
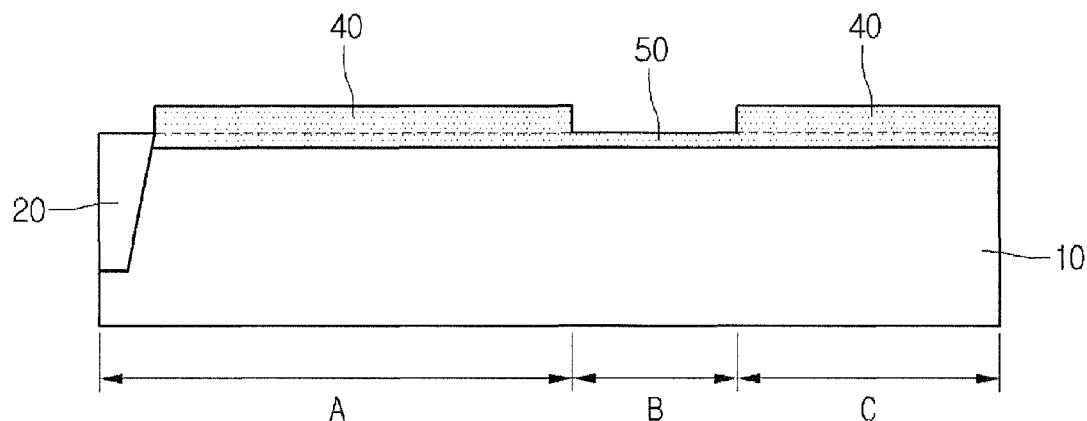

Accordingly, as shown in FIG. 3, the gate dielectric 50 is provided on the semiconductor substrate 10 in the transistor region B, and the first dielectric pattern 40 is provided in the photodiode region A and the floating diffusion region C.

The gate dielectric 50 is provided by the lower dielectric 31 formed below the surface of the semiconductor substrate 10 in the transistor region B. The first dielectric pattern 40 is provided by the first dielectric 30 formed above and below the surface of the semiconductor substrate 10 in the photodiode region A and the floating diffusion region C. Thus, the gate dielectric 50 is thinner than the first dielectric pattern 40.

Figure 4:
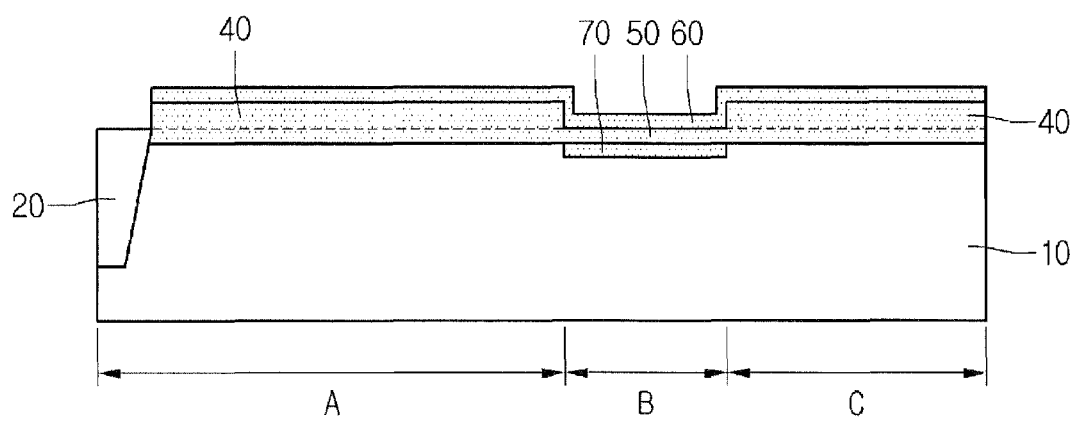

Referring to FIG. 4, a dummy dielectric 60 can be formed on the first dielectric pattern 40 and the gate dielectric 50. According to an embodiment, the dummy dielectric 60 can be formed of an oxide (e.g., $SiO_2$) in an $O_2$ gas atmosphere through a heat-treating process.

At this point, a second dielectric 70 can be formed under the gate dielectric 50. The second dielectric 70 can be formed by a reaction of the gate dielectric 50 with the semiconductor substrate 10 while the dummy dielectric 60 is formed. This is because the gate dielectric 50 has a small thickness and an oxide rapidly grows under the gate dielectric 50 while the dummy dielectric 60 is formed. Although a second dielectric may be formed under the first dielectric pattern 40, since the first dielectric pattern 40 has a larger thickness than the gate dielectric 50, the second dielectric formed under the first dielectric pattern 40 has a relatively small thickness. Further, in certain embodiments, the second dielectric may not form at all under the first dielectric pattern 40.

Figure 5:
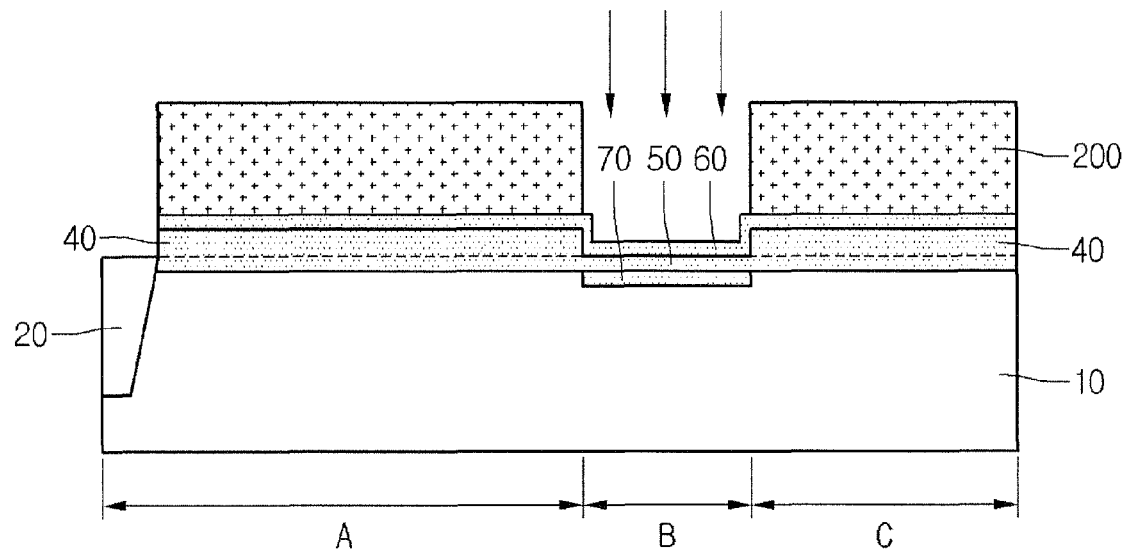
Figure 6:
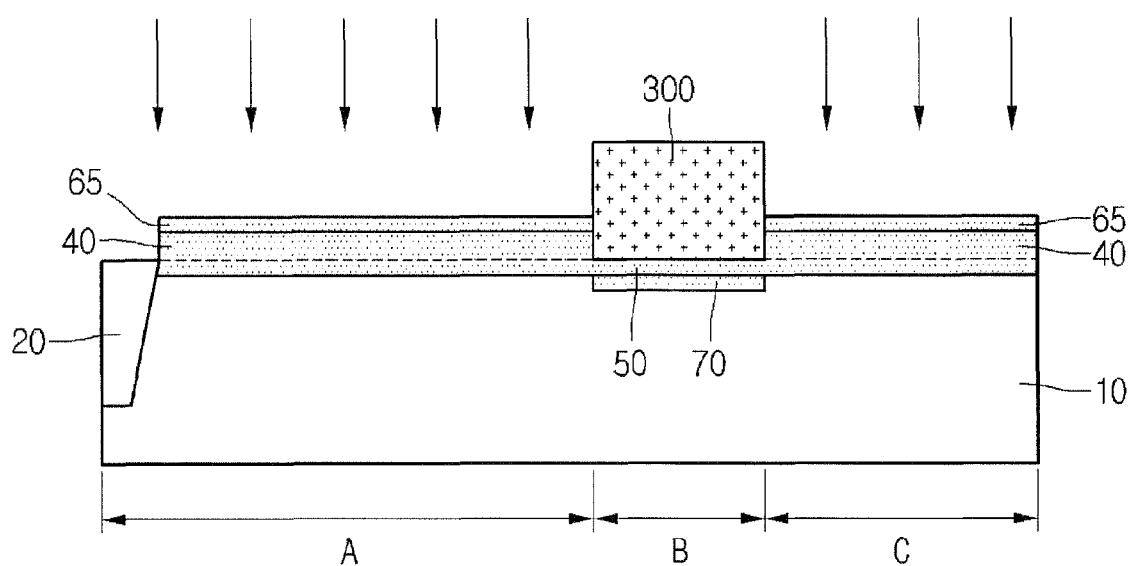

Referring to FIGS. 5 and 6, a second photoresist pattern 200 can be formed to expose the transistor region B on the semiconductor substrate 10.

The second photoresist pattern 200 can be formed to expose the transistor region B and cover the photodiode region A and the floating diffusion region C. In this case, the mask for forming the first photoresist pattern 100 can also be used for the second photoresist pattern 200.

An etching process can be performed with respect to the dummy dielectric 60 using the second photoresist pattern 200 as an etch mask. In certain embodiments, the dummy dielectric 60 can be removed through a wet or dry etching method.

Thus, a portion of the dummy dielectric 60 disposed in the transistor region B and exposed through the second photoresist pattern 200 is removed, and a dummy first dielectric pattern 65 covered by the second photoresist patterns 200 remains in the photodiode region A and the floating diffusion region C by the remaining dummy dielectric 60. As such, since the portion of the dummy dielectric 60 in the transistor region B is removed, only the gate dielectric 50 and the second dielectric 70 remain in the transistor region B on the semiconductor substrate 10.

Thereafter, the second photoresist pattern 200 can be removed.

As described above, the gate dielectric 50 and the second dielectric 70 are formed in the transistor region B below the surface of the semiconductor substrate 10, so that a movement path of photoelectrons to be formed later is spaced a predetermined distance from the surface of the semiconductor substrate 10. The second dielectric 70 extends the depth of the gate dielectric 50 into the substrate 10.

Referring to FIG. 6, a third photoresist pattern 300 can be formed to cover the transistor region B on the semiconductor substrate 10. The third photoresist pattern 300 can be formed to cover the transistor region B while exposing the photodiode region A and the floating diffusion region C.

Then, an etching process can be performed with respect to the dummy first dielectric pattern 65 in the photodiode region A and the floating diffusion region C, using the third photoresist pattern 300 as an etch mask. In an embodiment, the dummy first dielectric pattern 65 can be removed through a wet etching method. In this case, only the dummy first dielectric pattern 65 may be removed by controlling an etching time, so that the first dielectric pattern 40 remains in the photodiode region A and the floating diffusion region C.

Thereafter, the third photoresist pattern 300 can be removed.

Figure 7:
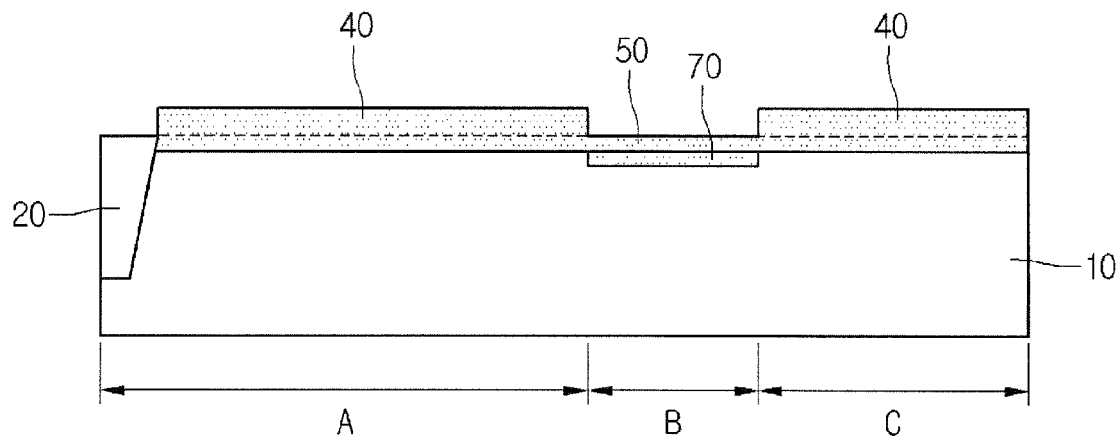

Referring to FIG. 7, the gate dielectric 50 and the second dielectric 70 remain under the surface of the semiconductor substrate 10 in the transistor region B. Also, the first dielectric pattern 40 remains above and below the surface of the semiconductor substrate 10 in the photodiode region A and the floating diffusion region C.

Thus, the thickness of the dielectric including the gate dielectric 50 and the second dielectric 70 in the transistor region B is thicker than a thickness of the portion of the first dielectric pattern 40 below the surface of the semiconductor substrate 10.

Referring to FIG. 8, a photodiode 80 can be formed in the photodiode region A, a gate 90 can be formed in the transistor region B, and a floating node 95 can be formed in the floating diffusion region C.

According to an embodiment, the gate dielectric 50 and the second dielectric 70 can be disposed below the top surface of the semiconductor substrate 10, thereby spacing the movement path of photoelectrons connected from the photodiode 80 to the floating node 95 by a predetermined distance from the surface of the semiconductor substrate 10.

Accordingly, the electron traps or flicker noise due to a defect, including the dangling bond formed on the surface of the semiconductor substrate 10, can be inhibited to improve the optical characteristics of the image sensor.

According to embodiments, the image sensor and the method of manufacturing the same can provide the gate dielectric extending under the surface of the semiconductor substrate. Accordingly, by extending the gate dielectric to a depth in the semiconductor substrate, the movement path of electrons from a source of a transistor to a drain of the transistor can be spaced a predetermined distance from the surface of the semiconductor substrate. Thus, the movement path of electrons from the photodiode to the floating node is spaced a predetermined distance from the surface of the semiconductor substrate, to inhibit formation of the electron trap or the flicker noise and improve the optical characteristics of the image sensor.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing an image sensor, the method comprising:
   providing a semiconductor substrate comprising a photodiode region, a transistor region, and a floating diffusion region;
   forming a first dielectric comprising an upper dielectric and a lower dielectric on the semiconductor substrate, wherein the upper dielectric extends above the surface of the semiconductor substrate and the lower dielectric, extends below the surface of the semiconductor substrate;
   forming a gate dielectric consisting of a portion of the lower dielectric in the transistor region and forming a first dielectric pattern in the photodiode region and the floating diffusion region by removing at least a portion of the upper dielectric in the transistor region;
   forming a second dielectric under the gate dielectric by forming a dummy dielectric on the first dielectric pattern and the gate dielectric and performing a heat-treating process, wherein during the heat-treating process the second dielectric forms under the gate dielectric; and
   removing the dummy dielectric.

2. The method according to claim 1, wherein the forming of the first dielectric comprising the upper dielectric and the lower dielectric comprises performing a thermal oxidation process.

3. The method according to claim 1, wherein the removing of the at least the portion of the upper dielectric in the transistor region comprises:
   forming a first photoresist pattern exposing the first dielectric in the transistor region; and
   performing an etching process with respect to the upper dielectric of the first dielectric using the first photoresist pattern as a mask.

4. The method according to claim 1, wherein the removing of the dummy dielectric comprises:
   forming a second photoresist pattern exposing the dummy dielectric in the transistor region; and
   performing an etching process to remove the dummy dielectric on the gate dielectric using the second photoresist pattern as a mask.

5. The method according to claim 4, further comprising:
   forming a third photoresist pattern covering the gate dielectric after removing the dummy dielectric on the gate dielectric; and
   performing a second etching process to remove the dummy dielectric on the first dielectric pattern using the third photoresist pattern as a mask.

6. The method according to claim 1, wherein the gate dielectric, the first dielectric pattern, and the second dielectric are formed of silicon dioxide ($SiO_2$).

7. The method according to claim 1, further comprising forming a gate on the gate dielectric.

8. The method according to claim 1, further comprising forming a photodiode in the photodiode region after forming the first dielectric pattern.

9. The method according to claim 1, further comprising:
   forming a floating node in the floating diffusion region after forming the first dielectric pattern.

* * * * *